United States Patent
Lashmore et al.

(10) Patent No.: US 7,898,079 B2
(45) Date of Patent: Mar. 1, 2011

(54) NANOTUBE MATERIALS FOR THERMAL MANAGEMENT OF ELECTRONIC COMPONENTS

(75) Inventors: David S. Lashmore, Lebanon, NH (US); Joseph J. Brown, Norwich, VT (US)

(73) Assignee: Nanocomp Technologies, Inc., Concord, NH (US)

( * ) Notice: Subject to any disclaimer, the term of this patent is extended or adjusted under 35 U.S.C. 154(b) by 921 days.

(21) Appl. No.: 11/413,512

(22) Filed: Apr. 28, 2006

(65) Prior Publication Data

US 2006/0269670 A1 Nov. 30, 2006

Related U.S. Application Data

(60) Provisional application No. 60/684,821, filed on May 26, 2005.

(51) Int. Cl.
*H01L 23/24* (2006.01)
*H01L 23/26* (2006.01)
*H01L 23/367* (2006.01)
*H01L 23/373* (2006.01)
*B32B 9/00* (2006.01)
*H05K 7/20* (2006.01)

(52) U.S. Cl. ............... 257/720; 257/706; 257/E23.101; 257/E23.106; 977/742; 977/753; 977/778; 428/408; 361/688; 361/704; 438/122

(58) Field of Classification Search ........................ None
See application file for complete search history.

(56) References Cited

U.S. PATENT DOCUMENTS 3,090,876 A 5/1963 Hutson 3,109,712 A 11/1963 Redfern (Continued)

FOREIGN PATENT DOCUMENTS

| EP | 1 160 861 | 12/2001 |
|---|---|---|
| JP | 2004-315297 | 11/2004 |
| JP | 2005/281672 | 10/2005 |

OTHER PUBLICATIONS

X. Tang, E. Hammel, M. Trampert et al, "Study of Carbon Nanofiber Dispersion for Application of Advanced Thermal Interface Materials", Proceedings of 1st Vienna International Conference Micro- and Nano-Technology (Viennano '05), Mar. 9-11, 2005, Vienna, Austria.*
http://www.merriam-webster.com/dictionary/adjacent (Jun. 2, 2009).*
http://www.merriam-webster.com/dictionary/along (Jun. 29, 2010).*
PCT International Search Report based on PCT/US06/16255 dated Oct. 17, 2007.

(Continued)

*Primary Examiner*—Callie E Shosho
*Assistant Examiner*—Frank D Ducheneaux
(74) *Attorney, Agent, or Firm*—Chinh H. Pham; Greenberg Traurig LLP

(57) ABSTRACT

A heat-conducting medium for placement between a heat source and heat sink to facilitate transfer of heat from the source to the sink is provided. The heat-conducting medium can include a flexible member made from an array of interweaving carbon nanotubes. The heat-conducting medium may also include an upper surface against which a heat source may be placed, an opposing lower surface and edges about the member designed for coupling to a heat sink toward which heat from the heat source can be directed. The heat-conducting medium may also include a pad placed on the upper surface to provide structural support to the member. A method for manufacturing the heat-conducting medium is also provided.

23 Claims, 2 Drawing Sheets

U.S. PATENT DOCUMENTS

| | | | |
|---|---|---|---|
| 4,358,699 | A | 11/1982 | Wilsdorf |
| 4,384,944 | A | 5/1983 | Silver et al. ............ 204/159.13 |
| 4,987,274 | A | 1/1991 | Miller et al. ............... 174/102 |
| 5,488,752 | A | 2/1996 | Randolph ................ 15/250.06 |
| 6,245,440 | B1 | 6/2001 | Kuhlmann-Wilsdorf et al. |
| 6,265,466 | B1 | 7/2001 | Glatkowski et al. ......... 523/137 |
| 6,333,016 | B1 | 12/2001 | Resasco et al. |
| 6,452,085 | B2 | 9/2002 | Tauchi et al. |
| 6,842,328 | B2 | 1/2005 | Schott et al. |
| 6,864,571 | B2 | 3/2005 | Arik et al. |
| 6,891,724 | B2 | 5/2005 | De Lorenzo et al. |
| 6,965,513 | B2 | 11/2005 | Montgomery et al. |
| 6,989,325 | B2 | 1/2006 | Uang et al. |
| 7,048,999 | B2 | 5/2006 | Smalley et al. ............. 428/367 |
| 7,182,929 | B1 | 2/2007 | Singhal et al. |
| 7,437,938 | B2 | 10/2008 | Chakraborty |
| 2001/0003576 | A1 | 6/2001 | Klett et al. |
| 2002/0004028 | A1 | 1/2002 | Margrave et al. |
| 2002/0040900 | A1 | 4/2002 | Arx et al. |
| 2002/0136681 | A1 | 9/2002 | Smalley et al. |
| 2002/0179564 | A1 | 12/2002 | Geobegan et al. |
| 2003/0117770 | A1 | 6/2003 | Montgomery et al. |
| 2003/0133865 | A1 | 7/2003 | Smalley et al. |
| 2003/0165648 | A1 | 9/2003 | Lobovsky et al. |
| 2004/0081758 | A1 | 4/2004 | Mauthner et al. |
| 2004/0124772 | A1 | 7/2004 | Chen |
| 2004/0265489 | A1 | 12/2004 | Dubin ........................ 427/212 |
| 2004/0266065 | A1 | 12/2004 | Zhang et al. ................ 438/122 |
| 2005/0006754 | A1 | 1/2005 | Arik et al. |
| 2005/0046017 | A1* | 3/2005 | Dangelo ..................... 257/720 |
| 2005/0048697 | A1 | 3/2005 | Uang et al. |
| 2005/0063658 | A1 | 3/2005 | Crowley |
| 2005/0067406 | A1 | 3/2005 | Rjarajan et al. |
| 2005/0074569 | A1 | 4/2005 | Lobovsky et al. ........... 428/36.9 |
| 2005/0269726 | A1* | 12/2005 | Matabayas .................. 264/104 |
| 2006/0118158 | A1 | 6/2006 | Zhang et al. |
| 2006/0252853 | A1 | 11/2006 | Ajayan et al. |
| 2006/0269670 | A1 | 11/2006 | Lashmore et al. ........ 427/249.1 |
| 2006/0272701 | A1 | 12/2006 | Ajayan et al. |
| 2007/0116627 | A1 | 5/2007 | Collier et al. |
| 2007/0140947 | A1 | 6/2007 | Schneider et al. |
| 2007/0151744 | A1 | 7/2007 | Chen .......................... 174/110 |
| 2007/0232699 | A1 | 10/2007 | Russell et al. |
| 2008/0170982 | A1 | 7/2008 | Zhang et al. |
| 2009/0044848 | A1 | 2/2009 | Lashmore et al. |
| 2009/0169819 | A1 | 7/2009 | Drzaic et al. |
| 2009/0194525 | A1 | 8/2009 | Lee et al. |
| 2009/0269511 | A1 | 10/2009 | Zhamu et al. |
| 2009/0277897 | A1 | 11/2009 | Lashmore et al. |

OTHER PUBLICATIONS

Berber, et al., "Unusually High Thermal Conductivity of Carbon Nanotubes", Physical Review Letters, vol. 84, No. 20 (May 2000).

Biercuk, et al., "Carbon Nanotube Composites for Thermal Management", Applied Physics Letters, vol. 80, Issue 15 (Apr. 2002).

Che, et al., "Thermal Conductivity of Carbon Nanotubes", Materials and Process Simulation Center, California Institute of Technology, Pasadena, CA (Mar. 2000).

Jung, et al., "Aligned Carbon Nanotube-Polymer Hybrid Architectures for Diverse Flexible Electronic Applications", Nano Letters, vol. 6, No. 3 (2006).

Tang, et al., "Study of Carbon Nanofiber Dispersion for Application of Advanced Thermal Interface Materials", Electrovac GmbH, Aufeldgasse 37-39, 3400 Klosterneuburg, Austria (Nano, 2005).

European Search Report based on EP 09 16 5823 dated Sep. 4, 2009.

R.T.K. Baker et al., "Nucleation and Growth of Carbon Deposits from the Nickel Catalyzed Decomposition of Acetylene", Journal of Catalysis, 26:51-62 (1972).

H.W. Kroto et al., "C60: Buckminsterfullerene", Letters to Nature, 318:162-163, (1985).

Sumio Iijima, "Helical microtubules of graphitic carbon", Letters to Nature, 354:56-58, (1991).

D.S. Bethune et al., Cobalt-catalyzed growth of carbon nanotubes with single-atomic-layer walls, Letters to Nature, 363:605-607 (1993).

M. Jose-Yacaman et al., "Catalytic growth of carbon microtubules with fullerene structure", Applied Physics Letters, 62(6):657-659 (1993).

Gun-Do Lee et al, "Catalytic decomposition of acetylene on Fe(001): A first-principles study", The American Physical Society, Physical Review B66 081403R:1-4 (2002).

N. Seo Kim et al., "Dependence of the Vertically Aligned Growth of Carbon Nanotubes on the Catalysts", The Journal of Physical Chemistry, 106(36):9286-9290 (2002).

H. W. Zhu et al., "Direct Synthesis of Long Single-Walled Carbon Nanotube Strands", Science, 296:884-886 (2002).

Ki-Hong Lee et al., "Control of growth orientation for carbon nanotubes", Applied Physics Letters, 82(3): 448-450, (2003).

E. F. Kukovitsky et al., "CVD growth of carbon nanotube films on nickel substrates", Applied Surface Science, 215:201-208 (2003).

Gou, J.G., "Single-Walled Carbon Nanotube Bucky Paper/Epoxy Composites: Molecular Dynamics Simulation and Process Development", PhD dissertation, The Florida State University, 2002, p. 9-126.

Okabe, T. et al., New Porous Carbon Materials, Woodceramics: Development and Fundamental Properties, Journal of Porous Materials, vol. 2, pp. 207-213, 1996.

Gou J.G., "Passage: Nanotube Bucky Papers and Nanocomposites", Ph.D. Dissertation, Marburg An Der Lahn, Jan. 1, 2002, pp. 93-126.

Hanson, G.W., "Fundamental Transmitting Properties of Carbon Nanotube Antennas", IEEE Transactions on Antennas and Propagation, vol. 53, No. 11, Nov. 2005, pp. 3426-3435.

Lee et al., "Synthesis of Carbon Nanotubes Over Gold Nanoparticle Supported Catalysts", Carbon, vol. 43, May 13, 2005, pp. 2654-2663.

Merriam Webster Dictionary definition of "along", available at http://merriam-webster.com/dictionary/along (Sep. 16, 2010).

Schaevitz et al., "A Combustion-Based Mems Thermoelectric Power Generator", The 11th Conference on Solid-State Sensors and Actuators, Munich, Germany, Jun. 10-14, 2001.

Xiao et al., "High-Mobility Thin-Film Transistors Based on Aligned Carbon Nanotubes", Applied Physics Letters, vol. 83, No. 1, Jul. 7, 2003, pp. 150-152.

Office Action cited in U.S. Appl. No. 11/415,927 mailed Feb. 22, 2010.

Office Action cited in U.S. Appl. No. 11/415,927 mailed Sep. 9, 2010.

Office Action cited in U.S. Appl. No. 11/715,756 mailed Jan. 25, 2010.

Office Action cited in U.S. Appl. No. 11/818,279 mailed Jun. 2, 2010.

Office Action cited in U.S. Appl. No. 12/187,278 mailed Jun. 11, 2010.

Office Action cited in U.S. Appl. No. 12/191,765 mailed May 14, 2010.

Office Action cited in U.S. Appl. No. 12/390,906 mailed Jul. 9, 2010.

International Search Report based on PCT/US2009/043209 dated Mar. 3, 2010.

European Search Report based on EP 06849762.7 dated Jan. 14, 2010.

Australian Examiner's Report cited in AU Serial No. 2006249601 dated Jun. 24, 2010.

Australian Examiner's Report cited in AU Serial No. 2006350110 dated Feb. 9, 2010.

* cited by examiner

| Thermal Grease | Rank | Die Temp | Ambient Temp | Delta Temp (C) |
|---|---|---|---|---|
| Arctic Silver III | 1 | 40.4 | 19.1 | 21.3 |
| TherMagic | 1 | 39.9 | 19.1 | 20.8 |
| Nanotherm | 1 | 40.4 | 19.1 | 21.3 |
| Cooling Flow | 1 | 40.9 | 19.3 | 21.6 |
| Shin-Etsu | 2 | 41.7 | 19.2 | 22.5 |

NANOTUBE MATERIALS FOR THERMAL MANAGEMENT OF ELECTRONIC COMPONENTS

RELATED US APPLICATION(S)

This application claim priority to U.S. Provisional Patent Application Ser. No. 60/684,821, filed May 26, 2005, which application is hereby incorporated herein by reference.

TECHNICAL FIELD

The present invention relates to systems and methods for thermal management of electronic components, and more particularly to a thermal junction device for facilitating heat transfer between a heat source and a heat sink.

BACKGROUND ART

Heat transfer for thermal management between two materials at different temperatures often may be accomplished by conduction, radiation and/or convection. In the area of electronics, in a narrow region at, for instance, an interface between a die lid (e.g., commonly a copper-tungsten material) of the integrated circuit and the heat sink, the temperature present in the integrated circuit (IC) can typically be between about 40° C. to 150° C. For such a situation, thermal management may typically be accomplished through conduction. However, the use of flat plates at the interface to facilitate the heat transfer from the integrated circuit to the heat sink has not been optimal. In particular, the use of a flat plate may provide only between 20 to 50 points of contact to the integrated circuit and/or the heat sink. As a result, the heat that flows out of the hot integrated circuit can only pass through these few contact spots.

To enhance the transfer of heat to the heat sink, current technology usually involves placing a thermally conducting grease between the die lid of an integrated circuit and the heat sink device. The heat sink device, in general, may be of any type, including a passive heat sink, a Peltier cooler, a refrigerated copper block, a heat pipe, or an active fan type, or a copper block in which embedded heat pipes can carry heat to a water-cooled bus outside of the system.

Presently, thermal greases that are commercially available typically contain silver powder or silver flake, and may be used by applying to machined, and occasionally, lapped heat sinks and integrated circuit lids. However, the thermal conductivity of these commercially available greases at best may only be about 9 watts/m-deg K. For example, (i) Arctic Silver III has a thermal conductivity of >9.0 W/m-deg K, (ii) AOS Thermal Compounds has a thermal conductivity of about 7.21 W/m-deg K, (iii) Shin-Etsu G751 has a thermal conductivity of about 4.5 W/m-deg K, (iv) AOS Thermal Compounds HTC-60 has a thermal conductivity of about 2.51 W/m-deg K, (v) Thermagon T-grease has a thermal conductivity of about 1.3 W/m-deg K, and (vi) Radio Shack Thermal Grease has a thermal conductivity of about 0.735 W/m-deg K. As illustrated in FIG. 1, there exists, generally, a 20 degrees difference between the heat source and the heat sink. Such a difference may indicate a thermal resistance at the junction and suggests that the potential to carry heat to the sink may be hurt by the poor interface provided by the grease.

It has been known that metal fiber structures and material can provide a low loss connection at greatly reduced forces, thereby providing high-efficiency, low force electrical contact. Based on simple laws of physics, the capability of fiber brushes to efficiently transfer electrical current across interfaces, which can be in relative motion or at rest, is paralleled by their capability to similarly transfer heat. In particular, since they operate at low loads and have very low resistance, they can dissipate relatively much less heat. Moreover, the fiber brushes can provide a substantial amount contact points between the heat source and heat sink to permit efficient heat transfer. As a result, metal fiber brushes have been used in a thermal interface as heat conduits for cooling or heating purposes. (U.S. Pat. No. 6,245,440)

Recently, carbon nanotubes have been used in thermal management. It has been shown that the thermal conductivity of carbon nanotubes is over 2980 watts/m-deg K as compared to thermal grease, which is only about 9 watts/m-deg K maximum (Thermal Conductivity of Carbon Nanotubes by Jianwei Che*, Tahir Cagin, and William A. Goddard III Materials and Process Simulation Center California Institute of Technology Pasadena, Calif. 91106 E-mail: jiche@caltech.edu. Even higher numbers are reported by Tománek (VOLUME 84, NUMBER 20 PHYSICAL REVIEW LETTERS 15 MAY 2000 "Unusually High Thermal Conductivity of Carbon Nanotubes," Savas Berber, Young-Kyun Kwon,* and David Tománek).

In addition, U.S. Pat. No. 6,891,724, discloses the use of carbon nanotubes deposited on a CVD diamond coated thermally heat die. In particular, a CVD diamond coating is placed on a heat die, and the die subsequently coated with carbon nanotubes.

In *Carbon nanotube composites for thermal management*, M. J. Biercuk, M. C. Llaguno, M. Radosavljevic, J. K. Hyun, and A. T. Johnson, Department of Physics and Astronomy and Laboratory for Research on the Structure of Matter, University of Pennsylvania, Philadelphia, Pa. 19104—Applied Physics Letters—Apr. 15, 2002—Volume 80, Issue 15, pp. 2767-2769, the authors discussed adding a small amount of carbon nanotubes, without surface modification, to an epoxy matrix to improve heat transfer.

In *Study of Carbon Nanofiber Dispersion for Application of Advanced Thermal Interface Materials*, Xinhe Tang*, Ernst Hammel, Markus Trampert, Klaus Mauthner, Theodor Schmitt, Electrovac GmbH, Aufeldgasse 37-39, 3400. Klosterneuburg, Austria and Jürgen Schulz-Harder, Michael Haberkorn, Andreas Meyer, Curamik Electronics GmbH, Am Stadtwald 2, 92676 Eschenbach, Germany, the authors described how adding carbon nanotubes to thermal grease improves thermal performance.

Others have developed approaches to aligning nanotubes in arrays for other applications. For example, Jung, Y. J., et al. "Aligned Carbon Nanotube-Polymer Hybrid Architectures for Diverse Flexible Electronic Applications." Nano Lett., 6 (3), 413-418, 2006, discloses a nanotube filled polymer but does not include thermal applications.

SUMMARY OF THE INVENTION

The present invention, in one embodiment, is directed to a heat-conducting medium for placement between a heat source and heat sink to facilitate transfer of heat from the source to the sink.

In one embodiment, the heat-conducting medium includes a disk, made from a material having a relatively high thermal conductivity characteristic, for placement between a heat source and a heat sink. The disk may also have a heat spreading characteristic. The heat-conducting medium further includes a first recessed surface on the disk for placement adjacent the heat source and an opposing second recessed surface on the disk for placement adjacent the heat sink. The heat-conducting medium may further include an array of heat conducting bristles extending from within the first and second recessed surfaces. In an embodiment, the recessed surfaces may be defined by a rim positioned circumferentially about the disk. The presence of the rim about each recessed surface acts to provide a spacer between the heat source and heat sink and to minimize the amount of pressure that may be exerted by the heat sink and the heat source against the bristles. The bristles, in an embodiment, may extend beyond the rim on the respective surface from which the bristle are positioned to provide a plurality of contact points to the heat source and to the heat sink to aid in the transfer of heat.

The present invention, in another embodiment, is directed to a substantially flexible heat-conducting medium. This heat-conducting medium, in one embodiment, includes a flexible member made from an array of interweaving carbon nanotubes. The flexible member may include an upper surface against which a heat source may be placed, an opposing lower surface, and edges about the member designed for coupling to a heat sink toward which heat from the heat source can be directed. The heat-conducting medium also includes a pad for placement on the upper surface of the member to provide structural support to the member. In an embodiment, a second pad may be provided against the lower surface of the member to provide additional support to the flexible member. The heat-conducting medium may further include a heat spreader positioned adjacent the heat source and the upper surface of the member to facilitate radial transfer of heat from the heat source to a wider area on the member. To the extent desired, a second heat spreader may be provided against the lower surface of the flexible member to enhance spreading of heat from the heat source radially along the flexible member.

In accordance with another embodiment, the present invention provides a method for manufacturing a heat-conducting medium. In one embodiment, a disk having opposing recessed surfaces and a relatively high thermal conductivity characteristic may initially be provided. Next, a plurality of catalyst particles may be deposited into the recessed surfaces. In an embodiment, prior to depositing the catalyst particles, the recessed surfaces may be coated with a material that can enhance attachment of the particles to the recessed surfaces. Thereafter, the catalyst particles may be exposed to a gaseous carbon source, and from the uptake of carbon by the catalyst particles, may be allowed to permit growth of nanotubes from the recessed surfaces. Once the nanotubes have extended beyond the recessed surfaces, the growth of the nanotubes may be terminated.

DESCRIPTION OF SPECIFIC EMBODIMENTS

The present invention provides, in one embodiment, a medium for thermal management of electronic components. The medium, in an embodiment may be a thinly designed device that may be place at a thermal junction between a heat source, such as an integrated circuit, and a heat sink to facilitate heat transfer from the heat source to the heat sink With reference now to FIG. 2, the present invention provides, in one embodiment, a heat-conducting medium 20 for carrying thermal energy away from a heat source. The heat-conducting medium 20, in an embodiment, includes a substantially thin disk 21 designed so that it may be placed in a narrow region at, for instance, an interface between a lid of a heat generating integrated circuit (IC) and a heat sink. To that end, disk 21 may be provided with a thickness ranging from about 2 millimeter (mm) to about 4 mm. Of course the thickness of the disk 21 may vary according to the particular application and placement. In addition, disk 21 may be made from a material having relatively high thermal conductivity and heat spreading characteristics, so as to facilitate heat transfer from the heat generating IC to the heat sink. Examples of such a material include copper, aluminum, beryllium, or a combination thereof. In one embodiment of the invention, disk 21 may be made from substantially high purity copper. Of course other materials may be used, so long as they provide disk 21 with high thermal conductivity and heat spreading characteristics.

Figures 1, 2:
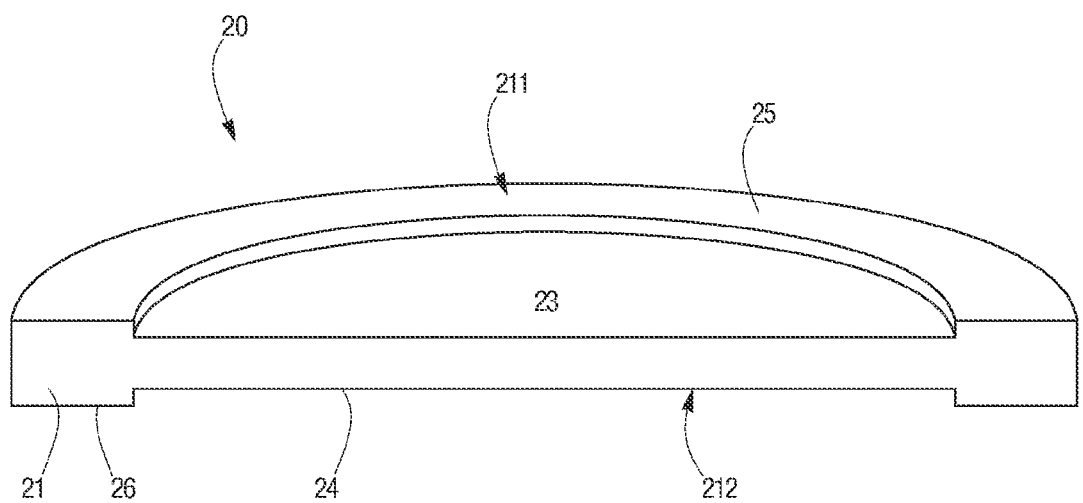
FIG. 1 illustrates a table with examples of commercial conducting greases and their thermal conductivity.
FIG. 2 illustrates a cross-sectional perspective view of a heat conducting medium in accordance with one embodiment of the present invention.

As illustrated in FIG. 2, disk 21 of heat-conducting medium 20 may include a first surface 211 for placement adjacent a heat source. Disk 21 may also include an opposing second surface 212 for placement adjacent a heat sink. In that manner, the first and second surfaces 211 and 212 may act as a conduit to pull heat from a heat source to the heat sink. First surface 211, in an embodiment, may be designed to include a recessed surface 23 defined by rim 25, while the second surface 212 may be designed to include a recessed surface 24 defined by rim 26. Recessed surfaces 23 and 24 may be situated, in an embodiment, approximately in the center of disk 21 for accommodating an array of carbon nanotube bristles 30 (see FIG. 3). To that end, the recessed surfaces 23 and 24 may be provided with a depth that is measurably less than the length of the nanotube bristles 30. In one embodiment, the depth of each recessed surface may be approximately between 100 microns and 500 microns or more, depending of the particular application and location at which the disk may be placed.

Rims 25 and 26, situated circumferentially about disk 21, may be provided, in an embodiment, to act as a spacer between the heat sink and the heat source. The presence of rims 25 and 26 on disk 21 may also act to limit the amount of pressure or provide the appropriate amount of pressure that may be exerted by the heat sink and heat source against the nanotube bristles 30. To the extent that a significant amount of pressure is exerted on the nanotube bristles 30, that is, significantly more than necessary, the bristles 30 may be damaged and the transfer of heat may be compromised.

It should be appreciated that the recessed surfaces 23 and 24 may be created by machining, coined on a coin press, or any other methods known in the art. In addition, although illustrated as circular in shape, the disk 21 may be provided with any geometric shape, for instance, square, hexagonal, octagonal etc., so long as the disk can act as an interface between a heat source and a heat sink.

Figure 3:
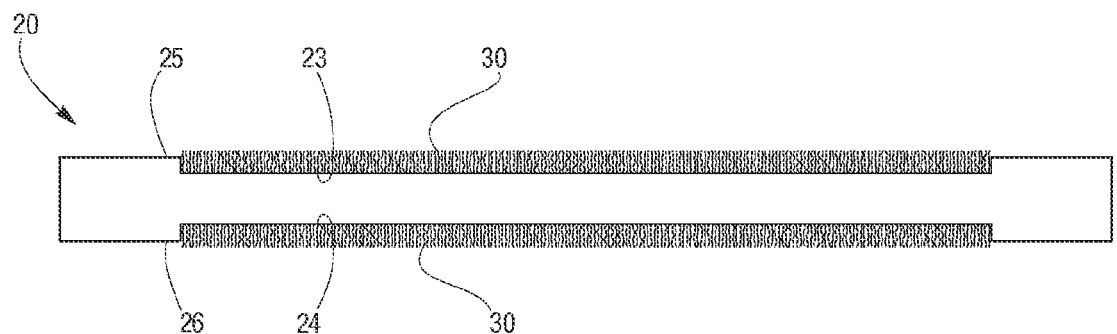
FIG. 3 illustrates a cross-sectional view of the heat-conducting medium in FIG. 2 having an array of nanotubes positioned within opposing recesses.

Looking now at FIG. 3, the heat-conducting medium 20 may also include an array of heat-conducting bristles 30 situated within recessed surfaces 23 and 24. The presence of the array of bristles 30, which may be flexible in nature, can overcome the low number of contact spots between the heat source and heat sink typically observed in prior art flat plate. In accordance with one embodiment of the present invention, the flexible bristles 30 may be situated substantially transverse to the recessed surfaces 23 and 24, and may extend or protrude from within recessed surfaces 23 and 24 to about 10 microns to about 100 microns or slight more beyond rims 25 and 26 of disk 21. In this way, the tips of the bristles 30 can maintain substantially good contact with the heat source and heat sink during use.

Moreover, because good thermal conductivity is necessary, bristles 30, in an embodiment, may be made from carbon nanotubes. The carbon nanotubes for use in connection with the heat-conducting medium 20 of the present invention may be single wall nanotubes or multi-wall nanotubes, and may, in an embodiment, be less than approximately 50 nm in diameter. It should be noted that by allowing the bristles 30 to extend beyond rims 25 and 26, disk 21, when situated within the narrow region or junction between the heat source and heat sink, can permit the heat sink and the heat source (e.g., lid of the IC) to both bear against rims 25 and 26 on disk 21, thereby bending the protruding flexible nanotube bristles 30 in such manner so as to maintain good thermal coupling to both the heat source and the heat sink.

By employing an array of nanotube bristles 30, the number of contact points can be significantly increased. In one embodiment, the number of contact points provided may range on the order of up to about $10^8$ per square centimeter or higher. Moreover, if, for instance, only about 20 percent of the surface of the apparent contact area is filled with nanotube bristles 30, then an approximate thermal conductivity can be estimated to be about 0.20*2980 watts/m-deg. K or about 600 watts/m-deg. K, which compares rather well with currently available 9 watts/m-deg K for thermally conducting grease.

It should be appreciated that although the amount of bristles 30 illustrated in FIG. 3 may be substantially similar on recessed surface 23 and recessed surface 24, the medium 20 can be designed so that the amount of bristles 30 on each surface may be uneven relative to one another. For example, if the heat source is a small die or small integrated circuit, the heat source side (i.e., surface 23) of disk 21 can be relatively smaller with fewer bristles 30 in comparison to the heat sink side (i.e., surface 24) of disk 21. With such a design the heat-conducting medium 20 may also act as a heat spreader, spreading heat from the smaller heat source surface 23 radially along the medium 20 to the larger heat sink surface 24. In addition, to the extent that there may be fewer bristles 30 on recessed surface 23, recessed surface 23, which may generally be similar in size to recessed surface 24, may be made to be smaller relatively to recessed surface 24. To provide a relatively smaller recessed surface 23, rim 25 may, in an embodiment, be made to be radially thicker.

The array of bristles 30, in an embodiment, may be provided on opposing recessed surfaces 23 and 24 of the disk 21 by various means known in the art. In one approach, coatings may be placed on the heat-conducting medium 20 in the region where the nanotube bristles 12 may grow (i.e., the recessed surfaces 23 and 24). These coatings may be selected so as not to react with the material from which the heat-conducting medium 20 may be made. The coatings may include, for example, iron, molybdenum, alumina, silicon carbon, aluminum nitride, tungsten or a combination thereof. In one embodiment, the coatings can be applied onto the recessed surfaces 23 and 24 by any means known in the art, so that a dense substantially pore-free deposit may be produced. In addition, certain catalysts may be deposited onto the coatings. Deposition of the catalysts onto the coatings can be accomplished, in an embodiment, by spraying, painting, screen-printing, evaporation or by any process known in the art. Catalysts that may be used in connection with the heat-conducting medium 20 of the present invention may generally be magnetic transition metals, examples of which include as iron, cobalt, nickel or a combination thereof. The catalyst particles may subsequently be exposed to a gaseous carbon source, such as that associated with a chemical vapor deposition (CVD) process, a well-known process in the art, and allowed to take up carbon to permit growth of nanotubes therefrom.

The heat conducting medium 20 of the present invention can overcome a number of problems, including a low number of contact spots observed in prior art flat plates by employing an array of flexible nanotube bristles 30. In particular, when placed within a junction between the heat source and heat sink, the bristles 30 on disk 21 may be pressed onto a hot surface of the heat source and act to carry heat away or act as a heat spreader from the surface of the heat source to a cooler heat sink in a manner that results in a low thermal resistance path between the heat source and the heat sink. In particular, heat can travel along the nanotube bristles 30 and across the thin disk 21 to the contacting surfaces with substantially low contact resistance. Presently thermal resistance between such heat source and a heat sink can be as high as 20 degrees Centigrade. It is believed that this thermal resistance can be reduced to a small fraction of this amount using the present invention. The consequences can be that the power dissipated can be increased, and the temperature of the heat source can also be reduced.

In addition, by employing an array of nanotube bristles 30, the temperature gradient required to drive heat to the heat sink can be reduced to much less than 20° C. Furthermore, rough interfaces may be accommodated so that lapping the interfaces may not be required. In other words, grinding of the rough interfaces may be minimized. Moreover, differences in the coefficient of thermal expansion between the heat source (e.g., lid of the IC) and the heat sink may be accommodated, so that, for example, expensive copper tungsten heat spreaders and the required brazing process can be eliminated. The heat-conducting medium 20 with an array of nanotube bristles 30 can also be used as a drop-in substitute for "conducting grease" taking up only a few mm in vertical geometry.

Figure 4:
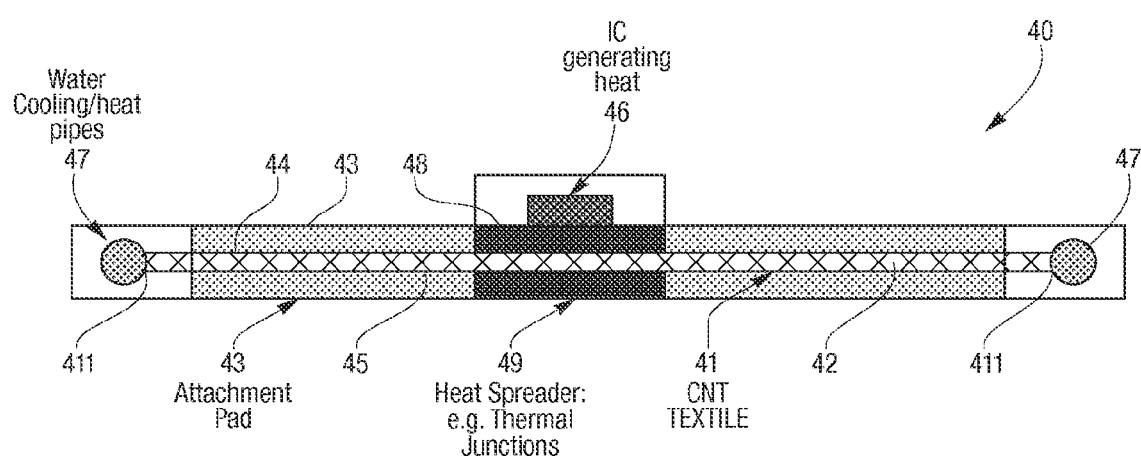
FIG. 4 illustrates a cross-sectional view of a heat-conducting medium in accordance with another embodiment of the present invention.

Looking now at FIG. 4, there is illustrated another heat-conducting medium 40 for thermal management in accordance with further embodiment of the present invention. The heat-conducting medium 40, in an embodiment, includes a flexible member 41, such as a mat or textile material made from carbon nanotubes. In other words, carbon nanotubes may be wound into fibers or yarns and the fibers or yarns formed or woven into a mat or textile material 41. The heat-conducting medium 40, in one embodiment, may be infiltrated with polyamide 42, epoxy, other polymers or a combination thereof.

The heat-conducting medium 40 may also include a pad 43 placed on upper surface 44 of textile material 41 to support a heat source, such as IC 46. The presence of pad 43 may also provide structural support to the flexible member 41. To the extent desired, pad 43 may also be placed against lower surface 45 of textile material 41 to provide additional structural support to the flexible member 41.

As illustrated in FIG. 4, the heat-conducting medium 40 may be used as a heat conducting medium in the manner similar to that discussed with medium 20 above. In particular, a heat source, such as IC 46 may be placed onto heat conducting medium 40 against the upper surface 44 of the flexible member 41. To that end, heat generated from the heat source may be carried by the flexible member 41 toward its edges 411 designed to couple to a heat sink, such as water cooling pipe 47, a heat pipe, or any material that passively conducts heat along the flexible member 41 away from the heat source 46.

In another embodiment, the heat-conducting medium 40 may further include a heat spreader 48 placed adjacent to the heat source 46 and the upper surface 44 of the flexible member 41. Heat spreader 48, in one embodiment, may be situated between the heat source 46 and the upper surface 44 of the textile material 41. As such, heat spreader 48 may act to facilitate the radial transfer of heat from the heat source 46 quickly to a wider area on the textile material 41 than otherwise may be, so that the heat from the heat source 46 may subsequently be carried to heat sink 47. As shown in FIG. 4, an additional heat spreader 49 may be positioned against the lower surface 45 of the textile material 41 to further facilitate the spreading of heat from the heat source 46 radially along the textile material 41. In an embodiment, the additional heat spreader 49 may be placed directly below the heat spreader 48 on the upper surface of the flexible member 41.

To the extent desired, the textile material 41 may also, in one embodiment of the present invention, be incorporated within, for example, a printed circuit board for diverting heat from a heat source. Alternatively, the textile material 41 may not be a textile or textile-like in nature, but rather, be part of a thermally conductive composite, such as a highly loaded carbon-carbon composite, where the fiber loading may be above about 50%, and further be directional in the direction of the heat flux.

While the invention has been described in connection with the specific embodiments thereof, it will be understood that it is capable of further modification. Furthermore, this application is intended to cover any variations, uses, or adaptations of the invention, including such departures from the present disclosure as come within known or customary practice in the art to which the invention pertains.

What is claimed is:

1. A heat-conducting medium for thermal management, the medium comprising:
    a flexible member made from carbon nanotubes, the member having:
        an upper surface adjacent to a heat source;
        an opposing lower surface; and
        edges about the periphery of the member designed for placement against a heat sink toward which heat from the heat source can be directed;
    a heat spreader positioned on the upper surface of the member for placement against the heat source, so as to facilitate radial transfer of heat from the heat source to a wider area on the flexible member; and
    a pad placed on the upper surface of the member, and extending in parallel to the upper surface of the member from the heat spreader towards the heat sink, to provide structural support to the member.

2. The medium as set forth in claim 1, wherein the flexible member includes a polymeric material dispersed therethroughout.

3. The medium as set forth in claim 2, wherein the polymeric material includes one of polyamide, epoxy or a combination thereof.

4. The medium as set forth in claim 1, wherein the pad further provides support for the heat spreader.

5. The medium as set forth in claim 1, further including a second pad placed against the lower surface of the member to provide additional structural support to the member.

6. The medium as set forth in claim 1, wherein the heat spreader is positioned between the heat source and the upper surface of the member.

7. The medium as set forth in claim 1, further including a second heat spreader positioned against the lower surface of the member to enhance spreading of heat from the heat source radially along the flexible member.

8. The medium as set forth in claim 7, wherein the second heat spreader is positioned against the lower surface directly below the heat spreader on the upper surface of the member.

9. A heat-conducting medium for thermal management, the medium comprising:
    a flexible member made from carbon nanotubes;
    a pad placed on an upper surface of the member to provide structural support to the member, and extending in parallel to the upper surface of the member;
    a heat spreader, independent of the pad, positioned on the surface of the member for placement against a heat source, so as to facilitate radial transfer of heat from the heat source to a wider area on the flexible member.

10. The medium as set forth in claim 9, wherein the flexible member includes a polymeric material dispersed therethroughout.

11. The medium as set forth in claim 10, wherein the polymeric material includes one of polyamide, epoxy or a combination thereof.

12. The medium as set forth in claim 9, further including a second pad placed against an opposing surface of the member to provide additional structural support to the member.

13. The medium as set forth in claim 9, wherein the heat spreader is positioned between the heat source and the surface of the member.

14. The medium as set forth in claim 9, further including a second heat spreader positioned against an opposing surface of the member to enhance spreading of heat from the heat source radially along the flexible member.

15. The medium as set forth in claim 14, wherein the second heat spreader is positioned against the opposing surface directly below the heat spreader on the surface of the member.

16. A heat-conducting medium for thermal management, the medium comprising:
    a flexible member made from carbon nanotubes, the member having:
        an upper surface adjacent to a heat source;
        an opposing lower surface; and
        edges about the periphery of the member designed for coupling to a heat sink toward which heat from the heat source can be directed;
    a heat spreader positioned adjacent the heat source and upper surface of the member to facilitate radial transfer of heat from the heat source to a wider area on the flexible member; and
    a pad placed in a plane within which the heat spreader is situated, and on the upper surface of the member while extending from the heat spreader towards the heat sink, to provide structural support to the member.

17. The medium as set forth in claim 16, wherein the flexible member includes a polymeric material dispersed therethroughout.

18. The medium as set forth in claim 17, wherein the polymeric material includes one of polyamide, epoxy or a combination thereof.

19. The medium as set forth in claim 16, wherein the pad further provides support for the heat spreader.

20. The medium as set forth in claim 16, further including a second pad placed against the lower surface of the member to provide additional structural support to the member.

21. The medium as set forth in claim 16, wherein the heat spreader is positioned between the heat source and the upper surface of the member.

22. The medium as set forth in claim 16, further including a second heat spreader positioned against the lower surface of the member to enhance spreading of heat from the heat source radially along the flexible member.

23. The medium as set forth in claim 22, wherein the second heat spreader is positioned against the lower surface directly below the heat spreader on the upper surface of the member.

* * * * *